United States Patent
Yoon

(10) Patent No.: US 9,163,821 B2
(45) Date of Patent: *Oct. 20, 2015

(54) HIGH-POWER OPTICAL ELEMENT STREET LAMP USING THERMOCOUPLE

(76) Inventor: Dong Han Yoon, Gumi-si (KR)

(*) Notice: Subject to any disclaimer, the term of this patent is extended or adjusted under 35 U.S.C. 154(b) by 313 days.

This patent is subject to a terminal disclaimer.

(21) Appl. No.: 13/703,869
(22) PCT Filed: Jun. 14, 2011
(86) PCT No.: PCT/KR2011/004326
§ 371 (c)(1), (2), (4) Date: Dec. 12, 2012
(87) PCT Pub. No.: WO2011/159076
PCT Pub. Date: Dec. 22, 2011

(65) Prior Publication Data
US 2013/0083516 A1    Apr. 4, 2013

(30) Foreign Application Priority Data
Jun. 14, 2010 (KR) .................. 10-2010-0056175

(51) Int. Cl.
F21V 29/00    (2015.01)
F21V 29/54    (2015.01)
(Continued)

(52) U.S. Cl.
CPC .............. *F21V 29/004* (2013.01); *F21V 29/54* (2015.01); *F21S 8/085* (2013.01); *F21S 8/086* (2013.01);
(Continued)

(58) Field of Classification Search
CPC ........ F21V 29/407; F21V 29/54; F21S 8/086; F21S 8/088; F21S 8/085; F21W 2131/103; Y02B 20/72; G01K 7/02; G01K 7/021; H01L 35/32; H01L 35/30; H01L 35/28; H01L 35/20
USPC ............ 362/183, 192, 431, 373, 294, 249.02; 136/224, 225, 226, 227, 203, 204, 122, 136/212, 211; 310/306, 307; 322/2 R
See application file for complete search history.

(56) References Cited

U.S. PATENT DOCUMENTS 3,775,218 A * 11/1973 Hare et al. .................... 156/264
6,329,217 B1 * 12/2001 Watanabe et al. ............... 438/48
(Continued)

FOREIGN PATENT DOCUMENTS

JP    4136453 B2    5/1992
JP    2004296989 A * 10/2004
(Continued)

OTHER PUBLICATIONS

Miyazaki, Substrate for light emitting diode device, Oct. 21, 2004, english translation.*

(Continued)

*Primary Examiner* — Peggy Neils
*Assistant Examiner* — James Endo
(74) *Attorney, Agent, or Firm* — Park & Associates IP Law, P.C.

(57) ABSTRACT

A high power optical element streetlamp using a thermocouple includes a body unit, a lamp head unit, and a power supply unit fixed to the body unit. The lamp head unit includes a circuit board connected to the power supply unit, at least one optical element installed on the lower surface of the circuit board, a molding, and a heat dissipation plate installed on the upper end of the circuit board and including a plurality of heat dissipation fins to dissipate heat generated and transmitted from the at least one optical element and the circuit board. The thermocouple is arranged in the shape of a checkerboard on the surfaces of the heat dissipation fins and converts dissipated heat into thermoelectromotive force, and forming junctions where two kinds of metals having different thermal conductivities intersect to generate thermoelectric current is formed on the heat dissipation plate.

15 Claims, 5 Drawing Sheets

(51) Int. Cl.
  *G01K 7/02* (2006.01)
  *H01L 35/20* (2006.01)
  *H01L 35/28* (2006.01)
  *H01L 35/32* (2006.01)
  *H01L 35/30* (2006.01)
  *F21S 8/08* (2006.01)
  *F21W 131/103* (2006.01)

(52) U.S. Cl.
  CPC .......... *F21S 8/088* (2013.01); *F21W 2131/103* (2013.01); *G01K 7/02* (2013.01); *G01K 7/021* (2013.01); *H01L 35/20* (2013.01); *H01L 35/28* (2013.01); *H01L 35/30* (2013.01); *H01L 35/32* (2013.01); *Y02B 20/72* (2013.01)

(56) References Cited

U.S. PATENT DOCUMENTS

| | | | | |
|---|---|---|---|---|
| 7,278,761 B2 * | 10/2007 | Kuan | | 362/294 |
| 2002/0047489 A1 * | 4/2002 | Oudakker | | 310/306 |
| 2005/0121065 A1 * | 6/2005 | Otey | | 136/205 |
| 2008/0006843 A1 * | 1/2008 | Dai et al. | | 257/99 |
| 2008/0087317 A1 * | 4/2008 | Takahashi | | 136/238 |
| 2009/0040750 A1 * | 2/2009 | Myer | | 362/183 |
| 2009/0175035 A1 * | 7/2009 | Jiang | | 362/234 |
| 2009/0207606 A1 * | 8/2009 | Tsao et al. | | 362/234 |
| 2009/0231851 A1 * | 9/2009 | Lai | | 362/253 |
| 2009/0303703 A1 * | 12/2009 | Kao et al. | | 362/183 |
| 2010/0037931 A1 * | 2/2010 | Luo | | 136/201 |
| 2010/0214775 A1 * | 8/2010 | Liang | | 362/184 |
| 2010/0220467 A1 * | 9/2010 | Daidone et al. | | 362/183 |
| 2010/0326487 A1 * | 12/2010 | Komori et al. | | 136/226 |
| 2010/0328951 A1 * | 12/2010 | Boissevain | | 362/249.02 |

FOREIGN PATENT DOCUMENTS

| | | | |
|---|---|---|---|
| KR | 200303694 | Y1 | 2/2003 |
| KR | 100871457 | B1 | 12/2008 |
| KR | 100923509 | B1 | 10/2009 |

OTHER PUBLICATIONS

International Search Report for PCT/KR2011/004326, Korean Intellectual Property Office, Feb. 8, 2012.

* cited by examiner

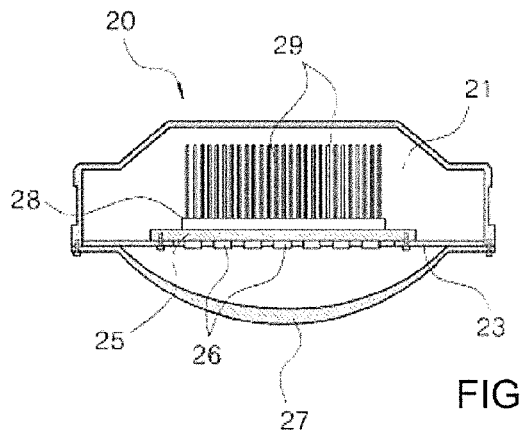

FIG. 4

| KINDS OF THERMOCOUPLES ||||||||
| Material | Old symbol | New symbol | Material || Wire Diameter (mm) | Normally working temperature (°C) | Overheating temperature (°C) | Electric resistance (Ω/m) |
| | | | +junction line | -junction line | | | | |
|---|---|---|---|---|---|---|---|---|
| platinum-rhodium | B | | platinum 70% rhodium 30% | platinum 94% rhodium 6% | 0.1 | 1,500 | 1,700 | 1.75 |
| platinum rhodium-platinum | R | | platinum, rhodium 13% | pure platinum | 0.5 | 1,400 | 1,600 | 1.47 |
| platinum rhodium-platinum | S | | platinum, rhodium 13% | pure platinum | | | | 1.43 |
| chromel-alumel | K | CA | alloy mainly containing nickel and chrome nickel: 90% chrome 10% | alloy mainly containing nickel nickle: 94% aluminum: 3% antimony: 1% manganese: 2% | 0.65 | 650 | 850 | 2.95 |
| | | | | | 1 | 750 | 950 | 1.25 |
| | | | | | 1.6 | 850 | 1,050 | 0.49 |
| | | | | | 2.3 | 900 | 1,100 | 0.24 |
| | | | | | 3.2 | 1,000 | 1,200 | 0.12 |
| chromel-constantan | E | CRC | alloy mainly containing nickel and chrome nickel: 90% chrome 10% | alloy mainly containing copper and nickel copper: 55% nickel: 45% | 0.65 | 450 | 500 | 3.56 |
| | | | | | 1 | 500 | 550 | 1.5 |
| | | | | | 1.6 | 550 | 650 | 0.59 |
| | | | | | 2.3 | 600 | 750 | 0.28 |
| | | | | | 3.2 | 700 | 800 | 0.15 |
| iron-constantan | J | IC | pure iron | alloy mainly containing copper and nickel copper: 55% nickel: 45% | 0.65 | 400 | 500 | 1.7 |
| | | | | | 1 | 450 | 550 | 0.72 |
| | | | | | 1.6 | 500 | 650 | 0.28 |
| | | | | | 2.3 | 550 | 750 | 0.14 |
| | | | | | 3.2 | 600 | 750 | 0.07 |
| copper-constantan | T | CC | pure copper | alloy mainly containing copper and nickel copper: 55% nickel: 45% | 0.32 | 200 | 250 | 0.17 |
| | | | | | 0.65 | 200 | 250 | 1.5 |
| | | | | | 1 | 250 | 300 | 0.63 |
| | | | | | 1.6 | 300 | 350 | |

FIG. 5

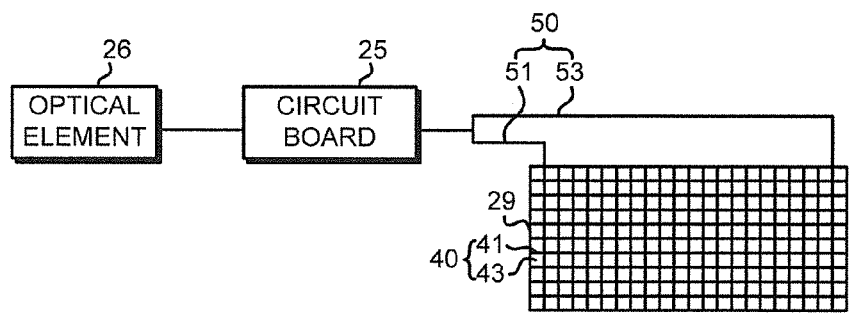

FIG. 6

HIGH-POWER OPTICAL ELEMENT STREET LAMP USING THERMOCOUPLE

PRIORITY

The present application claims priority under 35 U.S.C. §371 to PCT Application PCT/KR2011/004326, filed on Jun. 14, 2011, which claims priority to Korean Patent Application No. 10-2010-0056175, filed on Jun. 14, 2010, the disclosures of which are hereby incorporated by reference in their entireties.

TECHNICAL FIELD

The present invention relates to a high power optical element streetlamp using a thermocouple, and more particularly to a high power optical element streetlamp using a thermocouple which dissipate high heat generated from a circuit board due to optical elements emitting light at high power, and reuses resources by executing energy conversion into thermoelectromotive force and then supplying electric energy to the optical elements so as to greatly reduce power consumption taken to turn the streetlamp on and to minimize power expenditure.

BACKGROUND ART

In general, applications of optical elements including light emitting diodes (LEDs) as next generation illumination sources have been gradually increased. Among these, an LED is a kind of semiconductor element which converts electrical energy into light energy using characteristics of a semiconductor formed of a specific compound, has high light conversion efficiency and thus achieves energy consumption reduction of up to 90% at maximum as compared with conventional illumination, such as incandescent lamps and fluorescent lamps, has a small size and is thus proper for miniaturization and lightweight trends, is capable of being infinitely expanded, and has a semi-permanent lifespan.

Further, since the LED has advantages that it does not execute thermal light-emission or discharge light-emission and does not require pre-heating and thus has fast response time and a simple lighting circuit, and does not use a discharge gas and a filament and thus has high impact resistance and is safe, scarcely causes environment pollution, executes high repetition pulse operation, decreases fatigue of the optical nerve and executes full color realization, the LED is widely used in various digital products or home appliances and peripheral devices. Particularly, as a high luminance LED solving a low luminance problem of the conventional LED comes onto the market, purposes and usages of the LED are expanded.

Particularly, since a white LED is very useful as indoor and outdoor illumination, the frequency of use of the white LED is rapidly expanding and it is predicted that the white LED will dominate the illumination market soon because the government promotes a plan of raising the supply rate of the white LED in consideration of high energy efficiency and environmentally friendly advantages of the white LED together with a tendency to replace incandescent lamps with fluorescent lamps.

Given the rapid speed of development of techniques using LEDs, it is judged that LEDs will graft onto streetlamps installed on a road through which persons and vehicles pass and used to allow pedestrians and vehicles to efficiently walk on and pass through the road at night.

Conventionally, illumination lamps for streetlamps are formed of a heavy metal harmful to the human body, such as halogen or mercury, and these lamps have a short lifespan and are periodically replaced and thus require considerable expenditure and effort for maintenance and repair. Therefore, high power LED lamps reducing power consumption and having excellent illumination performance are widely used now. The high power LED lamps have a long lifespan and remarkably reduce power consumption to save energy while having high brightness as compared to a general halogen or mercury lamp.

However, the high power LED lamps generate high heat in operation, and such heat influences peripheral parts as well as the high power LED lamps and thus may cause malfunction thereof or reduction in the lifespan thereof.

That is, an optical element using light sources, such as LEDs, is essentially a semiconductor element, and is thus relatively weak to heat as compared to light emitting elements, such as incandescent lamps or fluorescent lamps. Therefore, when junctions within the semiconductor element maintain a constant temperature, the semiconductor element may maintain the original advantages thereof, such as high light emitting efficiency and long lifespan. That is, in case of an LED, the LED may maintain the original advantages thereof if the temperature of junctions of the semiconductor element maintains 85° C. or less always.

Therefore, research on techniques relating to optical elements, such as LEDs, to improve light emitting efficiency of LED chips and to efficiently extract the light emitting efficiency and research on application of optical element light sources to various fields have been conventionally carried out. However, as heat generated from an optical element during driving directly influences optical efficiency of the optical element light source and the optical element is applied to high power lamps, problems due to generated heat become serious.

Accordingly, a structure of an optical element in which a heat dissipation plate serving to dissipate heat generated during driving of the optical element is connected to a semiconductor element has been proposed.

In relation to such a heat dissipation plate applied to LEDs, Korean Utility Model Registration No. 20-0448163 discloses a heat dissipation plate for LED lamps which is installed on an LED lamp. Such a heat dissipation plate for LED lamps includes at least one heat dissipation fin connected to a case of the lamp and formed on the upper portion of the heat dissipation plate to have a sufficient heat dissipation area, a support to fix a circuit board on which at least one LED is mounted, at least one connection fixing groove formed on the lower portion of the heat dissipation plate so that the support is inserted into the at least one connection fixing groove, and a fixing screw to fix the circuit board to the support, the support includes at least one screw hole formed at a designated interval along the center of the support, the circuit board includes at least one tightening hole formed along the center of the circuit board so as to correspond to the at least one screw hole of the support, the at least one LED is arranged between the at least one tightening hole and is installed integrally with the heat dissipation plate for LED lamps by fixing the circuit board to the support by combining the fixing screw with the at least one screw hole and the at least one tightening hole, the at least one heat dissipation fin is formed integrally with the at least one connection fixing groove, and the heat dissipation plate for LED lamps is formed of an extruded product using aluminum and may thus minimize heat resistance and maximize heat dissipation effect.

Further, in relation to a streetlamp to which LEDs and a heat dissipation plate are applied, Korean Utility Model Laidopen Publication No, 20-2008-0003317 discloses a cooling apparatus of a high power LED lamp streetlamp having an LED lamp assembly provided with a plurality of high power LED lamps. Such a cooling apparatus includes a thermally conductive heat collecting plate provided with an adhesive surface attached to one surface of the LED lamp assembly opposite the high power LED lamps and including a receipt groove part formed on the other surface of the heat collecting plate, a heat exchange tub combined with the receipt groove part of the heat collecting plate and accommodating a liquid heat medium executing heat exchange with the thermally conductive heat collecting plate, and a plurality of thin heat dissipation plates separated from the outer circumferential surface of the heat exchange tub by a designated interval and executing heat exchange with the heat medium in the heat exchange tub, and increases exchange and dissipation performance and efficiency of high heat generated from the LED lamps, thus improving cooling performance of the LED lamps and preventing malfunction of the lamps and peripheral parts or reduction of lifespans thereof due to heat.

However, the above-described conventional heat dissipation plates merely exhibit a function of dissipating heat, generated from semiconductor elements due to light emission of optical elements, to the outside, and such heat is only dissipated to the outside but is not used as energy. Recently, as problems due to lack of resources become more serious, solutions to conserve resources are urgently required and development of techniques to improve requirements for using waste heat inevitably generated in the optical element field having a high application degree are required.

DISCLOSURE

Technical Problem

Therefore, the present invention has been made in view of the above problems, and it is an object of the present invention to provide a high power optical element streetlamp using a thermocouple which prevents lowering of a lifespan due to degradation while dissipating high heat, generated from optical elements emitting light at high power and a circuit board to drive the optical elements, through a heat dissipation plate, and reuses waste heat by converting the waste heat into electromotive force and supplies the electromotive force to the optical elements as electric energy to greatly reduce power consumption and expenditure required to turn the streetlamp on and to increase energy efficiency of the optical elements.

It is another object of the present invention to provide a high power optical element streetlamp using a thermocouple which has a structure allowing external air to flow into the streetlamp, induces natural convection in which, when air flows into a cylindrical portion of a support or inner grooves of the support, the temperature of air is raised while passing through a power supply unit, and the introduced air uniformly disperses heat transmitted to a heat dissipation plate, and thus increases production of electricity using waste heat so as to maximize energy efficiency.

Technical Solution

In accordance with an aspect of the present invention, the above and other objects can be accomplished by the provision of a high power optical element streetlamp using a thermocouple including a body unit fixed to the ground surface and extended upward, a lamp head unit formed at a position separated in the forward direction from the upper end of the body unit and facing the ground surface, and a power supply unit fixed to the body unit and applying energy necessary to drive the lamp head unit to supply power to the lamp head unit and to control operation of the lamp head unit, wherein the lamp head unit includes a circuit board connected to the power supply unit, operated by power supplied from the power supply unit and formed of a metal having excellent thermal conductivity, at least one optical element installed on the lower surface of the circuit board, a molding cover located below the at least one optical element, connected to the lamp head unit and protecting and supporting the at least one optical element, and a heat dissipation plate installed on the upper end of the circuit board and including a plurality of heat dissipation fins to dissipate heat generated and transmitted from the at least one optical element and the circuit board, wherein the thermocouple arranged in the shape of a checkerboard on the surfaces of the heat dissipation fins, converting dissipated heat into thermoelectromotive force, and forming junctions where two kinds of metals having different thermal conductivities intersect to generate thermoelectric current is formed on the heat dissipation plate.

The high power optical element streetlamp may further include a solar panel on which a plurality of cells converting sunlight into electric energy is formed, provided on the upper surface of the lamp head unit.

The high power optical element streetlamp may further include a charging device connected to the thermocouple and the solar panel of the lamp head unit, sufficiently storing electric energy generated through thermoelectric current of the thermocouple or generated by the solar panel and supplying the electric energy to the circuit board to drive the at least one optical element as needed.

The heat dissipation plate may further include an external connection terminal formed of a metal, provided with one end connected to the metal of the thermocouple at the outer rim of the thermocouple and the other end connected to one side of the circuit board, collecting thermoelectric current generated from the thermocouple, converting the thermoelectric current into electric energy, and supplying the electric energy as a power source of the at least one optical element.

The external connection terminal may collect thermoelectric current generated from the thermocouple, supply the thermoelectric current to the circuit board so as to be used as the power source of the at least one optical element, and be divided into an anode terminal and a cathode terminal.

An inflow hole through which air flows into the body unit from the outside may be formed on the body unit at a position where the power supply unit is installed, an air circulation path in a hollow shape connecting the inflow hole to the lamp head unit to form a moving pathway of air may be formed in the body unit, and a supply hole through which the air circulation path communicates with the lamp head unit may be formed at a connection portion of the front end of the body unit where the lamp head unit is installed, so as to induce natural convection so that heat transmitted to the heat dissipation plate is uniformly dispersed.

The high power optical element streetlamp may further include a power transmission cable connecting the power supply unit to the circuit board installed on the lamp head unit and, when AC current converted from DC current through the power supply unit is transmitted, maintaining a voltage stage of the current transmitted to the circuit board.

The power transmission cable may include copper wires having a fine diameter and transmitting current from the power supply unit to the circuit board, and a tube into which the copper wires are inserted to surround the circumferences of the copper wires to protect the copper wires.

At least one copper wire may be provided within the tube. The copper wires may be enamel coated copper wires formed of enamel.

The thermocouple may include a plurality of first metal bodies arranged in the horizontal direction on one or both flat side surfaces of the heat dissipation fins and separated by the same interval, and a plurality of second metal bodies arranged in the vertical direction so as to intersect the plurality of first metal bodies and separated by the same interval on the heat dissipation fins.

The plurality of first metal bodies and the plurality of second metal bodies of the thermocouple may be formed of a thin metal sheet by depositing metal powder or nano metal powder so as to be formed on the heat dissipation fins through silk screen printing.

The plurality of first metal bodies and the plurality of second metal bodies of the thermocouple may be formed of materials having different thermal conductivities, cause exothermic reactions with heat transmitted from the at least one optical element and the circuit board at different temperatures, and generate thermoelectric current due to a temperature difference between different reaction temperatures according to thermal conductivities.

Each of the plurality of first metal bodies and the plurality of second metal bodies of the thermocouple may form one electrode from among an anode generating a high electric potential and a cathode generating a low electric potential, so that the plurality of first metal bodies and the plurality of second metal bodies form electrodes having different polarities.

The plurality of first metal bodies and the plurality of second metal bodies of the thermocouple may be formed of one kind of alloy material, selected from the group consisting of platinum-rhodium, platinum rhodium-platinum, chromel-alumel, chromel-constantan, iron-constantan and copper-constantan.

The thermocouple may be formed to generate thermoelectric current in different types by differently selecting at least one of alloy ratios, kind of metals, metal wire diameters, normally working temperatures, overheating temperatures and electric resistances of the alloy materials forming the plurality of first metal bodies and the plurality of second metal bodies.

Advantageous Effects

In the high power optical element streetlamp in accordance with the present invention, heat generated from the optical elements turned on at high power and the circuit board controlling the turning-on of the optical elements is dissipated through the heat dissipation plate to prevent lowering of the lifespan of the streetlamp due to degradation, and simultaneously, waste heat dissipated through the heat dissipation plate is converted into thermoelectromotive force by reaction of the thermocouple and is supplied as electric energy to greatly reduce power consumption and expenditure required to turn the streetlamp on and to reuse waste resources, i.e., waste heat, as electric energy to increase energy efficiency.

Further, the high power optical element streetlamp in accordance with the present invention has a structure allowing external air to flow into the streetlamp and thus lowers the temperature of the accommodating space of the lamp head unit to increase prevention of lowering the lifespan of the streetlamp due to degradation of the circuit board, and induces natural convection of increasing conductivity to uniformly disperse heat transmitted to the heat dissipation plate by air and thus increases production of electricity using heat energy of waste heat to maximize energy efficiency.

Further, in the high power optical element streetlamp in accordance with the present invention, the power supply unit is installed at a position separated from the circuit board and thus heating of the power supply unit together with the circuit board is minimized to maintain the lifespans of the circuit board and the power supply unit, and the circuit board and the power supply unit are connected by the power transmission cable and thus voltage drop in which an electric potential is lowered by resistance during the current moving process does not occur although the circuit board and the power supply unit are located at positions separated from each other and voltage is transmitted to the circuit board while maintaining the intensity of voltage to prevent power loss.

Further, in the above-described high power optical element streetlamp in accordance with the present invention, in addition to electric energy converted from waste heat, solar energy is stored and is then used as a power source to operate the optical elements and thus power consumption and expenditure may be more reduced, and electric energy is charged through sunlight at day and heat energy at night and is supplied as needed and thus energy may be produced using natural resources so as to turn the streetlamp on, thus more increasing energy efficiency.

DESCRIPTION OF DRAWINGS

The above and other objects, features and other advantages of the present invention will be more clearly understood from the following detailed description taken in conjunction with the accompanying drawings, in which:

FIG. 4 is a partially enlarged view illustrating the high power optical element streetlamp in accordance with the embodiment of the present invention;

FIG. 5 is a table representing kinds of thermocouples in accordance with the embodiment of the present invention;

FIG. 6 is a view illustrating the concept of the thermocouple in accordance with the embodiment of the present invention;

BEST MODE

Figure 1:
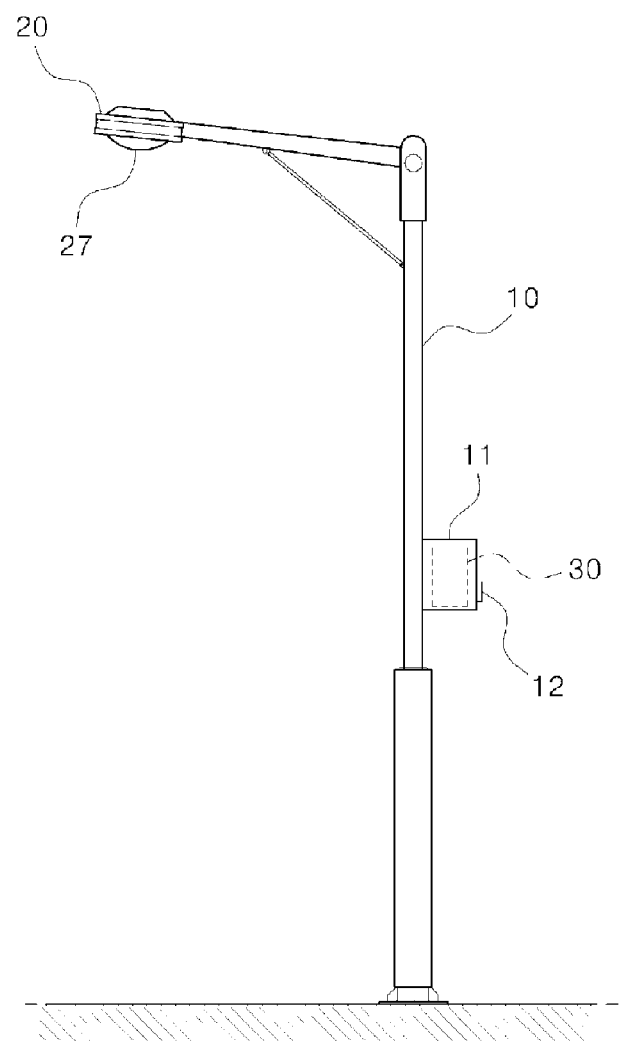
FIG. 1 is a side view illustrating a high power optical element streetlamp using a thermocouple in accordance with one embodiment of the present invention.

Now, high power optical element streetlamps using a thermocouple in accordance with preferred embodiments of the present invention will be described in detail with reference to the annexed drawings. In the drawings, the same or similar elements are denoted by the same reference numerals even though they are depicted in different drawings, and a detailed description thereof will thus be omitted because it is considered to be unnecessary.

However, the embodiments of the present invention may be variously modified, and it is not interpreted that the scope of the invention is limited by embodiments described later. The embodiments of the present invention have been made only for those skilled in the art to better understand the present invention, and the shapes, etc. of elements shown in the drawings are exemplarily given to more clearly describe the present invention.

First, a high power optical element streetlamp using a thermocouple in accordance with one embodiment of the present invention, as shown in FIGS. 1 to 6, includes a body unit 10, a lamp head unit 20, and a power supply unit 30.

Figure 2:
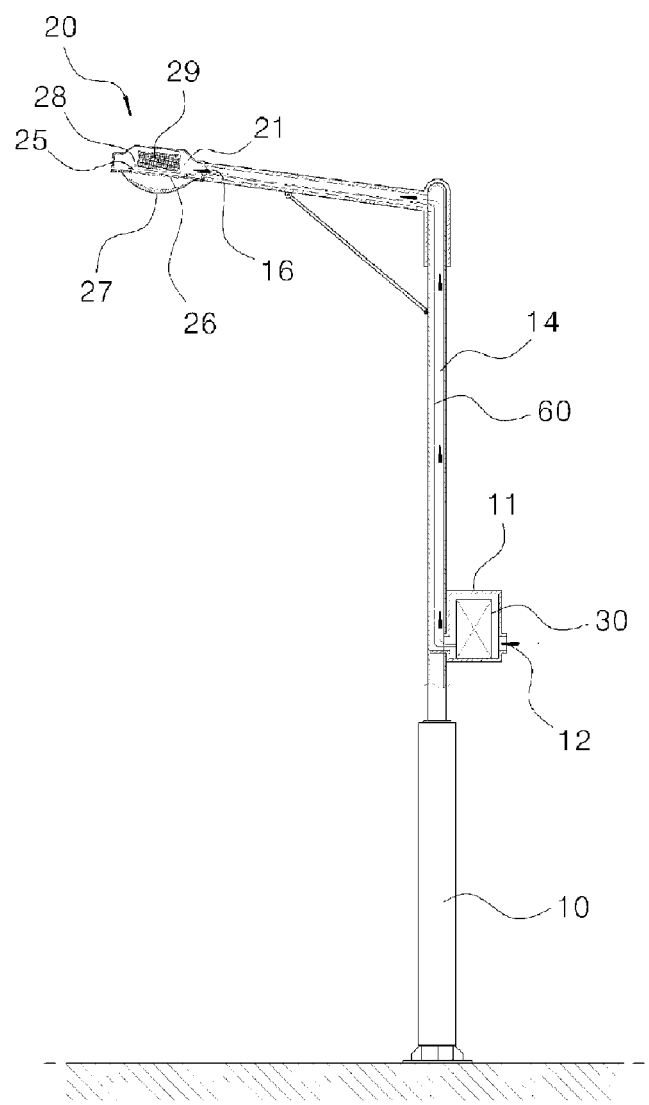
FIG. 2 is a cross-sectional view illustrating the high power optical element streetlamp in accordance with the embodiment of the present invention.

As shown in FIGS. 1 and 2, the body unit 10 forms a flange having a flat surface on the lower end thereof to fixedly install the body unit 10 on the ground surface, and is extended upward in a cylindrical shape so that the lamp head unit 20 is located at the upper end of the body unit 10 separated from the ground surface.

The lamp head unit 20 is formed at a position separated in the forward direction from the upper end of the body unit 10, and faces the ground surface.

A circuit board 25, optical elements 26, a molding cover 27 and a heat dissipation plate 28 are fixed to the lamp head unit 20.

Figure 3:
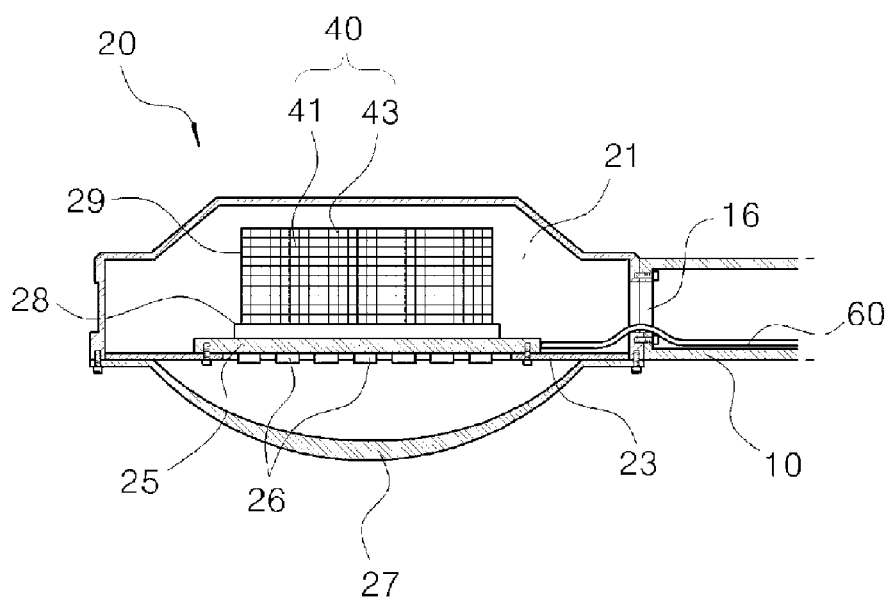
FIG. 3 is a partially enlarged view illustrating a lamp head unit of FIG. 2.

The lamp head unit 20, as shown in FIGS. 3 and 4, forms an accommodating space 21 in which the circuit board 25 and the heat dissipation plate 28 are located and installed. That is, an interception plate 23 is installed at the lower portion of the lamp head unit 20 to form the accommodating space 21 and closes the opened lower surface of the lamp head unit 20, and the circuit board 25 and the heat dissipation plate 28 are installed within the accommodating space 21 (on the interception plate 23).

The lower surface (the surface in a direction of the molding cover 27) of the interception plate 23 may be formed of a material having excellent reflection efficiency to light generated from the optical elements 26. In more detail, a reflective surface is formed by applying a material having excellent light reflectivity, i.e., one selected from the group consisting of metals and metal alloys including gold, silver, copper and platinum, to the lower surface of the interception plate 23 or by depositing such a material processed into a thin film type on the lower surface of the interception plate 23.

The lamp head unit 20 may be formed to have a semi-elliptical shape with a gentle curve, or may be formed to have various cross-sectional shapes, such as a rectangular shape forming a rectangular parallelepiped, as long as the accommodating space 21 is sealed from the outside.

The circuit board 25 is connected to the power supply unit 30, is operated by power supplied from the power supply unit 30, and serves to control light emission of the optical elements 26.

The circuit board 25 is formed of a metal having excellent thermal conductivity. That is, the circuit board 25 is formed of a metal having higher thermal conductivity than a synthetic resin and ceramic, and conducts heat transmitted from the optical elements 26 or generated from the circuit board 25 to the heat dissipation plate 28.

For example, the circuit board 25 is formed of a mixture of a material generally having non-conductive characteristics which forms an insulating layer, such as silicon or epoxy, and a material to improve thermally conductive characteristics, such as alumina or copper powder, and is preferably a metal core printed circuit board (MCPCB) having an excellent heat dissipating function among metals.

Further, the metal circuit board 25 may use an aluminum oxide film as an insulating layer. The insulating layer of the aluminum oxide film is formed through electrical reaction between an aluminum surface and an electrolyte solution.

Further, the metal circuit board 25 may use a pure aluminum oxide layer formed by anodization to have excellent thermal conductivity maintaining the original thermal conductivity of 30~35 W/mK of an aluminum oxide.

One or plural optical elements 26 may be installed on the lower surface of the circuit board 25.

The molding cover 27 below the optical elements 26 is connected to the lamp head unit 20, and serves to protect and support the optical elements 26. That is, the molding cover 27 is fixed to the lamp head unit 20 and forms a space in which the optical elements 26 are isolated from external environments.

The molding cover 27 may be formed to exhibit optical effects of amplifying light generated from the optical elements 26. That is, the molding cover 27 is formed such that the thickness of the molding cover 27 is the maximum at the central portion thereof where the optical elements 26 are located and is gradually decreased in sideward directions from the central portion thereof, so as to exhibit the effect of a convex lens and thus to amplify light generated from the optical elements 26.

Further, the molding cover 27 may be formed such that the thickness of the molding cover 27 is the minimum at the central portion thereof and is gradually increased in sideward directions from the central portion thereof, and so as to exhibit the effect of a concave lens. However, in consideration that directivity of an angle (30~60°) mainly required in streetlamps and straightness of light generated from the optical elements 26, the molding cover 27 is preferably formed so as to exhibit the effect of a convex lens.

The molding cover 27 is formed of a transparent resin. That is, fluorescent materials may be mixed with a material forming the molding cover 27 so as to realize various background effects through light emitted from the optical elements 26 according to place where the optical elements 26 are used and necessity.

The heat dissipation plate 28 is installed on the upper end of the circuit board 25, and includes a plurality of heat dissipation fins 29 to dissipate heat generated and transmitted from the optical elements 26 and the circuit board 25.

The heat dissipation fins 29 of the heat dissipation plate 28 include a thermocouple 40 converting heat generated from the optical elements 26 and heat energy transmitted by the circuit board 5 into thermoelectromotive force to generate thermoelectric current.

The thermocouple 40 is based on the fundamental action of a thermoelectric element causing the thermoelectric effect.

Here, the thermoelectric element means a semiconductor element executing conversion between heat energy and electric energy. That is, the thermoelectric element is a generic name for elements using various effects exhibited by interaction between heat and electricity, i.e., a thermistor used in stabilization of a circuit and detection of heat, power and light, an element using the Seebeck effect for temperature measurement, and a Peltier element used for manufacture of a freezer and a constant-temperature incubator.

Such a thermocouple 40 is formed using the Seebeck effect among various effects of thermoelectric elements.

Here, the Seebeck effect is an effect in which electromotive force is generated by a temperature difference between junctions of two different metals. In more detail, the Seebeck effect refers to a phenomenon in which current is generated in a metal circuit when two different metals are connected in a loop shape, and one junction is in a high temperature state and the other junction is in a low temperature state.

Electromotive force generated according to the Seebeck effect is proportional to the temperature difference between the two junctions. Further, the intensity of the thermoelectric current is varied according to kinds of metals in a pair and a temperature difference between two junctions, and electric resistance of a metal wire participates in the intensity of the thermoelectric current.

The thermocouple 40 is configured such that two kinds of metals having different thermal conductivities intersect on the surfaces of the heat dissipation fins 29. In more detail, the thermocouple 40 is configured such that the thermocouple 40 converts heat transmitted from the optical elements 26 and the circuit board 25 into theremoelectromotive force and thus thermoelectric current is generated at junctions where the two kinds of metals having different thermal conductivities intersect.

The thermocouple 40 is arranged in the shape of a checkerboard on the surfaces of the heat dissipation fins 29. That is, the thermocouple 40 is formed in a lattice shape in which plural lines formed of metals are horizontally and vertically separated by designated intervals on the flat side surfaces of the plural heat dissipation fins 29 of the heat dissipation plate 28.

The thermocouple 40 may be formed on one side surface of each of the heat dissipation fins 29, or may be formed on both side surfaces of each of the heat dissipation fins 29. Preferably, the thermocouple 40 is formed on both side surfaces of each of the heat dissipation fins 29 to effectively transmit waste heat generated from the optical elements 26 and the circuit board 25.

The thermocouple 40 includes a plurality of first metal bodies 41 arranged in the horizontal direction on one or both flat side surfaces of the heat dissipation fins 29 and separated by the same interval and a plurality of second metal bodies 43 arranged in the vertical direction so as to intersect the plurality of first metal bodies 41 and separated by the same interval on the heat dissipation fins 29. The first metal bodies 41 and the second metal bodies 43 are formed of two kinds of metals having different thermal conductivities.

The first metal bodies 41 and the second metal bodies 43 forming the thermocouple 40 are formed of a thin metal sheet by depositing metal powder or nano metal powder so that the first metal bodies 41 and the second metal bodies 43 may be formed on the heat dissipation fins 29 through silk screen printing.

The first metal bodies 41 and the second metal bodies 43 of the thermocouple 40 are formed of materials having different thermal conductivities, cause exothermic reactions with heat transmitted from the optical elements 26 and the circuit board 25 at different temperatures, and generate thermoelectric current due to a temperature difference between different reaction temperatures according to thermal conductivities. That is, since the first metal bodies 41 and the second metal bodies 43 are differently formed of a good conductive metal material and an insulating metal material, one of the first metal bodies 41 and the second metal bodies 43 formed of the good conductive metal material has high thermal conductivity and thus causes an exothermic reaction at a high temperature, the other of the first metal bodies 41 and the second metal bodies 43 formed of the insulating metal material has low thermal conductivity and thus causes an exothermic reaction at a low temperature, and voltage is generated due to a temperature difference between the different reaction temperatures under the same heat condition and is converted into thermoelectromotive force generating flow of current and thus thermoelectric current is generated at the junctions where the first metal bodies 41 and the second metal bodies 43 intersect.

Each of the first metal bodies 41 and the second metal bodies 43 of the thermocouple 40 form one of an anode generating a high electrical potential and a cathode generating a low electrical potential, and thus the first metal bodies 41 and the second metal bodies 43 form electrodes having different polarities. That is, one having high thermal conductivity of the first metal bodies 41 and the second metal bodies 43 has a high position energy of charges, i.e., a high electric potential, and thus forms an anode, and the other having low thermal conductivity has a low electric potential and thus forms a cathode.

The first metal bodies 41 and the second metal bodies 43 of the thermocouple 40 are formed of one kind of alloy material, selected from alloy materials including platinum-rhodium, platinum rhodium-platinum, chromel-alumel, chromel-constantan, iron-constantan, and copper-constantan, as shown in FIG. 5.

Using the above-described alloy materials, the thermocouple 40 is formed to generate thermoelectric current in different types by differently selecting at least one of alloy ratios, kinds of metals, metal wire diameters, normally working temperatures, overheating temperatures and electric resistances of the materials of the first metal bodies 41 and the second metal bodies 43, with reference to FIG. 5.

For example, the thermocouple 40 generates thermoelectric current by differently selecting alloy ratios of alloy materials forming the first metal bodies 41 and the second metal bodies 43. That is, the first metal bodies 41 and the second metal bodies 43 forming the thermocouple 40 are formed of the same alloy material, i.e., platinum-rhodium, but one having high conductivity to generate a high electrical potential among the first metal bodies 41 and the second metal bodies 43 is formed of an alloy containing 70% of platinum and 30% of rhodium so as to generate an exothermic reaction at a high temperature, the other having low conductivity to generate a low electrical potential among the first metal bodies 41 and the second metal bodies 43 is formed of an alloy containing 94% of platinum and 6% of rhodium so as to generate an exothermic reaction at a low temperature, and thus heat energy is converted into theremoelectromotive force to generate thermoelectric current at junctions where the first metal bodies 41 and the second metal bodies 43 intersect due to a temperature difference. That is to say, although the same exothermic temperature condition of waste heat generated from the optical elements 26 and the circuit board 5 is applied both to the first metal bodies 41 and the second metal bodies 43, the first metal bodies 41 and the second metal bodies 43 generate heat at different temperatures, and thermoelectric current is generated by the effect of thermoelectromotive force due to the temperature difference.

Further, the thermocouple 40 may generate thermoelectric current by differently selecting kinds of alloy materials forming the first metal bodies 41 and the second metal bodies 43. That is, if the first metal bodies 41 and the second metal bodies 43 forming the thermocouple 40 are formed of different kinds of metals, i.e., chromel and alumel, one having high conductivity among the first metal bodies 41 and the second metal bodies 43 is formed of an alloy mainly containing nickel and chrome, i.e., an alloy of 90% of nickel and 10% of chrome, and the other having low conductivity among the first metal bodies 41 and the second metal bodies 43 is formed of an alloy mainly containing nickel, i.e., an alloy of 94% of nickel, 3% of aluminum, 1% of antimony and 2% of manganese, and thus thermoelectric current is generated by a temperature difference due to different thermal conductivities of the first metal bodies 41 and the second metal bodies 43.

The heat dissipation plate 28 further includes an external connection terminal 50 provided with one end connected to the metal of the thermocouple 40 at the outer rim of the thermocouple 40 and the other end connected to one side of the circuit board 25, as shown in FIG. 6. That is, the external connection terminal 50, one end of which is connected to the thermocouple 40, collects thermoelectric current generated from the thermocouple 40, converts the thermoelectric current collected from the thermocouple 40 into electric energy, and supplies the electric energy as a power source of the optical elements 26 to the circuit board 25 to which the other end of the external connection terminal 50 is connected.

The external connection terminal 50 is formed of a conductive metal (for example, silver, copper, aluminum, etc.).

An insulator (not shown) is formed at the periphery of the external connection terminal 50 so as to insulate the external connection terminal 50 from the outside.

The insulator is formed of an insulating material, which is a nonconductor (for example, a synthetic resin, silicon, ceramic, etc) which does not transmit electricity.

The external connection terminal 50 collects thermoelectric current generated from the thermocouple 40 and supplies the thermoelectric current to the circuit board 25 so as to be used as a power source of the optical elements 26, and is divided into an anode terminal 51 and a cathode terminal 53. Specifically, the anode terminal 51 is connected to one generating high thermoelectric current among the first metal bodies 41 and the second metal bodies 43 forming the thermocouple 40 and thus positive charges are transmitted to the anode terminal 51, and the cathode terminal 53 is connected to the other generating low thermoelectric current among the first metal bodies 41 and the second metal bodies 43 forming the thermocouple 40 and thus negative charges are transmitted to the cathode terminal 53.

A case 11 to support and protect the power supply unit 30 installed therein is formed on the body unit 10.

An inflow hole 12 through which air flows into the case 11 from the outside is formed on the case 11 of the body unit 10 at a position where the power supply unit 30 is installed.

At least one inflow hole 12 is formed on the case 11, and if plural inflow holes 12 are formed, the inflow holes 12 are preferably formed at positions in all directions so that air may flow into the case 11 from any direction.

The inflow hole 12 may be formed in a porous type in which a plurality of pores is formed in a lattice shape, to prevent inflow of residual materials into the case 11.

An air circulation path 14 communicating the inflow hole 12 with the lamp head unit 20 is formed in the body unit 10. That is, the air circulation path 14 has a hollow shape of the body unit 10 in the upward direction to the lamp head unit 20 starting from the inflow hole 12, thus forming a moving pathway of air.

A supply hole 16 through which the air circulation path 14 communicates with the lamp head unit 20 is formed at a connection portion of the front end of the body unit 10 where the lamp head unit 20 is installed, in the direction of the air circulation path 14, thus supplying air from the outside to the lamp head unit 20.

The above-described structure in which the inflow hole 12 formed on the body unit 10 communicates with the supply hole 16 via the air circulation path 14 may induce natural convection so that heat generated from the optical elements 26 and the circuit board 25 and transmitted to the heat dissipation plate 28 is uniformly dispersed on the heat dissipation fins 29.

The power supply unit 30 is fixed to the body unit 10 and serves to apply energy necessary for driving so as to supply power to the lamp head unit 20 and to control operation of the lamp head unit 20.

The power supply unit 30 converts DC current into AC current and supplies energy to drive the optical elements 26 of the circuit board 25. The power supply unit 30 may employ various inverter structures generally used in electrical apparatuses, and a detailed description thereof will thus be omitted.

The streetlamp further includes a power transmission cable 60 connecting the power supply unit 30 to the circuit board 25 installed on the lamp head unit 20. In more detail, when AC current converted from DC current through the power supply unit 30 is transmitted, the power transmission cable 60 maintains a voltage stage of the current transmitted to the circuit board 25.

Figure 7:
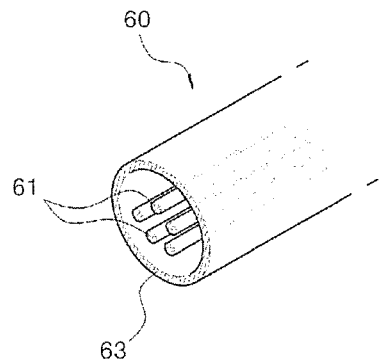
FIG. 7 is a perspective view illustrating the cross-sectional state of a power transmission cable in accordance with the present invention.

The power transmission cable 60 includes copper wires 61 having a fine diameter of 0.2 mm and transmitting current from the power supply unit 30 to the circuit board 25, and a tube 63 into which the copper wires 61 are inserted to surround the circumferences of the copper wires 61 and thus to protect the copper wires 61, as shown in FIG. 7.

At least one copper wire 61 is provided within the tube 63. Preferably, 5~10 copper wires 61 are provided so as to transmit current of 5~10 amperes required to turn the optical elements 26 on.

The copper wires 61 are enamel coated copper wires 61 formed of enamel. That is, the power transmission cable 60 including the enamel coated copper wires 61 transmits voltage to the circuit board 25 while maintaining the intensity of voltage transmitted from the power supply unit 30.

For example, when AC current obtained by conversion of the power supply unit 30 flows to the circuit board 25 along the power transmission cable 60, voltage drop in which an electric potential is lowered in the direction of current by resistance does not occur and voltage is transmitted to the circuit board 25 while maintaining the intensity of voltage transmitted from the power supply unit 30. That is, in case of a general electric wire other than the power transmission cable 60, when current of 24 volts is supplied from the power supply unit 30, voltage drop occurs during transmission by a distance (approximately 10M) to the circuit board 25, the current is lowered by 2.4 volts, and thus power loss is generated. However, the power transmission cable 60 may prevent voltage drop.

The tube 63 may be formed of one selected from the group consisting of transparent and opaque synthetic resins. Preferably, the tube 63 is formed of a transparent synthetic resin so that a user may confirm the state of the copper wires 61.

If the tube 63 is formed of a transparent synthetic resin, as described above, the copper wires 61 located at the inside of the tube 63 are preferably formed in various colors, such as blue and green, to provide a pleasing external appearance.

When the optical elements 26 are turned on by energy transmitted along the power transmission cable under the control of the power supply unit 30, as described above, the circuit board 25 including the optical elements 26 gradually generate heat, such heat generated from the optical elements 26 and the circuit board 25 is conducted to the heat dissipation plate 28 connected to the circuit board 25, the thermocouple 40 converts the heat into electric energy and then supplies the electric energy to the optical elements 26, and thus waste heat is reused as a power source of the optical elements 26. In more detail, when heat generated from the optical elements 26 and the circuit board 25 by turning the optical elements 26 on and operating the circuit board 25 to turn the optical elements 26 on is discharge through the heat dissipation fins 29 of the heat dissipation plate 28, the first and second metal bodies 41 and 43 of the thermocouple 40 formed on the heat dissipation fins 29 react with conducted heat at different temperatures, thermoelectric current is generated by conversion of heat into thermoelectromotive force at the junctions where the first metal bodies 41 and the second metal bodies 43 reacting with the heat at the different temperatures intersect and is converted into electric energy via the external connection terminal 50, and such electric energy is supplied to the circuit board 25 and is used as a power source to turn the optical elements 26 on.

That is, in the high power optical element streetlamp in accordance with this embodiment of the present invention, heat generated from the optical elements turned on at high power and the circuit board controlling the turning-on of the optical elements is dissipated through the heat dissipation plate to prevent lowering of the lifespan of the streetlamp due to degradation, and simultaneously, waste heat dissipated through the heat dissipation plate is converted into thermoelectromotive force by reaction of the thermocouple and is supplied as electric energy to greatly reduce power consumption and expenditure required to turn the streetlamp on and to reuse waste resources, i.e., waste heat, as electric energy to increase energy efficiency.

Further, the high power optical element streetlamp in accordance with this embodiment of the present invention has a structure allowing external air to flow into the streetlamp and thus lowers the temperature of the accommodating space of the lamp head unit to increase prevention of lowering the lifespan of the streetlamp due to degradation of the circuit board, and induces natural convection of increasing conductivity to uniformly disperse heat transmitted to the heat dissipation plate by air and thus increases production of electricity using heat energy of waste heat to maximize energy efficiency.

Further, in the high power optical element streetlamp in accordance with this embodiment of the present invention, the power supply unit is installed at a position separated from the circuit board and thus heating of the power supply unit together with the circuit board is minimized to maintain the lifespans of the circuit board and the power supply unit, and the circuit board and the power supply unit are connected by the power transmission cable and thus voltage drop in which an electric potential is lowered by resistance during the current moving process does not occur although the circuit board and the power supply unit are located at positions separated from each other and voltage is transmitted to the circuit board while maintaining the intensity of voltage to prevent power loss.

Figure 8:
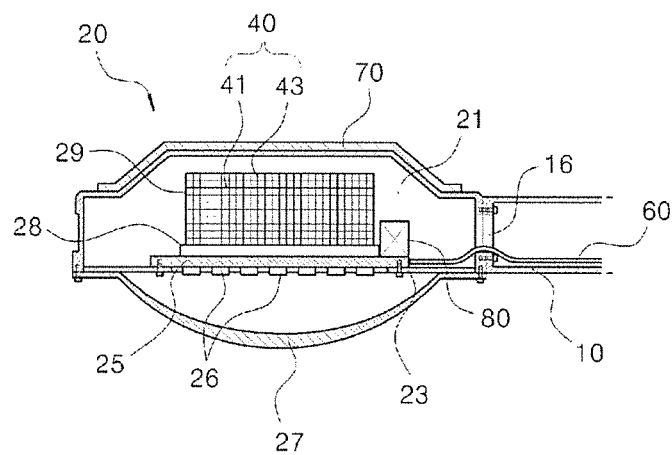
FIG. 8 is a partially enlarged view illustrating a high power optical element streetlamp using a thermocouple in accordance with another embodiment of the present invention.
Figure 9:
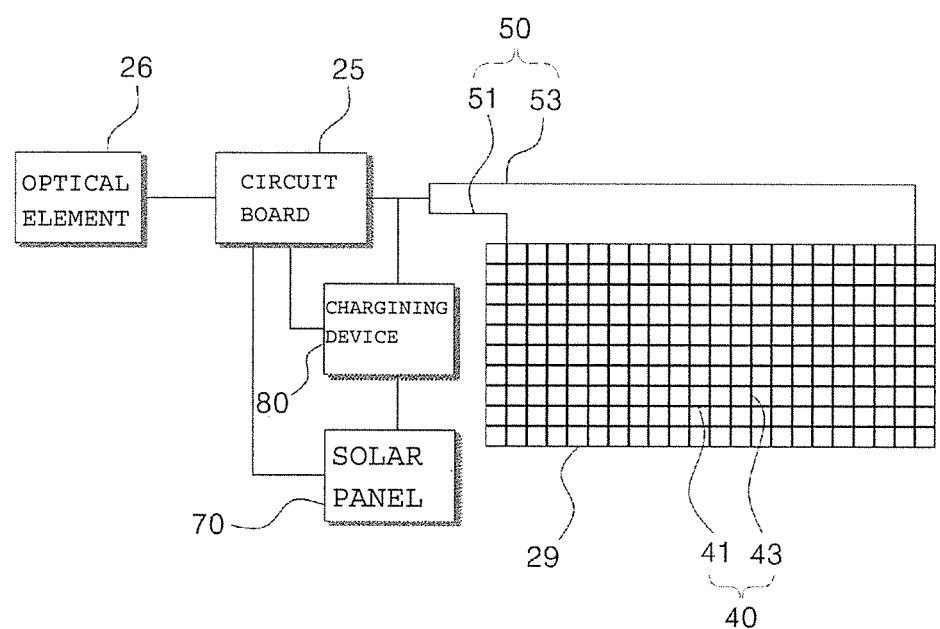
FIG. 9 is a view illustrating the concept of the thermocouple in accordance with the embodiment of the present invention.

Next, a high power optical element streetlamp using a thermocouple in accordance with another embodiment of the present invention, as shown in FIGS. 8 and 9, further includes a solar panel 70 which a plurality of cells (not shown) converting sunlight into electric energy is formed, provided on the upper surface of the lamp head unit 20.

The solar panel 70 includes a connection unit (not shown) connecting the plural cells and connecting the cells to the circuit board 25.

The solar panel 70 preferably includes a sheet (not shown) formed on the upper surface thereof to protect the plural cells from the outside.

The high power optical element streetlamp in accordance with this embodiment of the present invention may further include a charging device 80 installed within the accommodating space 21 of the lamp head unit 20 and connected to the thermocouple 40 and the solar panel 70 of the lamp head unit 20 to charge energy. That is, the charging device 80 is connected to the thermocouple 40 and the solar panel 70, sufficiently stores electric energy generated through thermoelectric current of the thermocouple 40 or generated by the solar panel 70, and supplies the electric energy to the circuit board 25 to drive the optical elements 26 as needed.

The charging device 80 includes a storage battery including an anode plate, a cathode plate and an electrolyte solution, storing chemical energy converted from electric energy, and regenerating electric energy from chemical energy as needed.

The charging device 80 may employ the miniaturized structure of a general storage battery used as a battery for vehicles, and a detailed description thereof will thus be omitted.

That is, in the above-described high power optical element streetlamp in accordance with this embodiment of the present invention, in addition to electric energy converted from waste heat, solar energy is stored and is then used as a power source to operate the optical elements and thus power consumption and expenditure may be more reduced, and electric energy is charged through sunlight at day and heat energy at night and is supplied as needed and thus energy may be produced using natural resources so as to turn the streetlamp on, thus more increasing energy efficiency.

Other components of the streetlamp in accordance with this embodiment are the same as those of the streetlamp in accordance with the above-described former embodiment, and a detailed description thereof will thus be omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A high power optical element streetlamp using a thermocouple comprising:
    a body unit extended upward;
    a lamp head unit affixed at an upper side of the body unit; and
    a power supply unit fixed to the body unit and applying energy necessary to drive the lamp head unit to supply power to the lamp head unit,
    wherein the lamp head unit includes a circuit board electrically connected to the power supply unit, operating by power supplied from the power supply unit and formed of a thermal conductive material, at least one optical element installed on a lower surface of the circuit board, a heat dissipation plate installed on an upper surface of the circuit board and having a plurality of heat dissipation fins attached thereto to dissipate heat from the at least one optical element and the circuit board, and a thermocouple coupled to the heat dissipation fins to convert the dissipated heat into thermo-electromotive force,
    wherein the thermocouple includes a plurality of first metal bodies with a first thermal conductivity intersecting a plurality of second metal bodies with a second thermal conductivity.

2. The high power optical element streetlamp according to claim 1, further comprising a solar panel provided on the upper surface of the lamp head unit for converting sunlight into electric energy.

3. The high power optical element streetlamp according to claim 2, further comprising a charging device connected to the thermocouple and the solar panel of the lamp head unit for storing electric energy generated by the thermocouple or by the solar panel and to supply the electric energy to the circuit board to drive the at least one optical element.

4. The high power optical element streetlamp according to claim 1, wherein the heat dissipation plate further includes an external connection terminal formed of a metal, provided with one end connected to the thermocouple at an outer rim of the thermocouple and the other end connected to the circuit board, for collecting the thermoelectric current generated from the thermocouple, converting the thermoelectric current into electric energy, and supplying the electric energy as a power source of the at least one optical element.

5. The high power optical element streetlamp according to claim 4, wherein the external connection terminal for collecting the thermoelectric current generated from the thermocouple and supplying the thermoelectric current to the circuit board as the power source of the at least one optical element, is divided into an anode terminal and a cathode terminal.

6. The high power optical element streetlamp according to claim 1, wherein an inflow hole through which air flows into the body unit from the outside is formed on the body unit at a position where the power supply unit is installed, an air circulation path in a hollow shape connecting the inflow hole to the lamp head unit to form a moving pathway of air is formed in the body unit, and a supply hole through which the air circulation path communicates with the lamp head unit is formed at a connection portion of the front end of the body unit where the lamp head unit is installed, so as to induce natural convection so that heat transmitted to the heat dissipation plate is uniformly dispersed.

7. The high power optical element streetlamp according to claim 1, further comprising a power transmission cable connecting the power supply unit to the circuit board installed on the lamp head unit and, when AC current converted from DC current through the power supply unit is transmitted, a voltage stage of the current transmitted to the circuit board is maintained.

8. The high power optical element streetlamp according to claim 7, wherein the power transmission cable includes copper wires having a fine diameter for transmitting current from the power supply unit to the circuit board, and a tube into which the copper wires are inserted to surround the circumferences of the copper wires to protect the copper wires.

9. The high power optical element streetlamp according to claim 8, wherein at least one copper wire is provided within the tube.

10. The high power optical element streetlamp according to claim 8, wherein the copper wires are enamel coated copper wires formed of enamel.

11. The high power optical element streetlamp according to claim 1,
wherein the plurality of first metal bodies of the thermocouple are arranged in the horizontal direction on one or both flat side surfaces of the heat dissipation fins and separated by the same interval; and
wherein the plurality of second metal bodies of the thermocouple are arranged in the vertical direction so as to intersect the plurality of first metal bodies and separated by the same interval on the heat dissipation fins.

12. The high power optical element streetlamp according to claim 11, wherein the plurality of first metal bodies and the plurality of second metal bodies of the thermocouple are formed of a thin metal sheet by depositing metal powder or nano metal powder so as to be formed on the heat dissipation fins through silk screen printing.

13. The high power optical element streetlamp according to claim 11, wherein the plurality of first metal bodies and the plurality of second metal bodies of the thermocouple are formed of materials having different thermal conductivities to cause exothermic reactions with heat transmitted from the at least one optical element and the circuit board at different temperatures, and generate thermoelectric current due to a temperature difference between different reaction temperatures according to thermal conductivities.

14. The high power optical element streetlamp according to claim 11, wherein each of the plurality of first metal bodies and the plurality of second metal bodies of the thermocouple forms one electrode from among an anode generating a high electric potential and a cathode generating a low electric potential, so that the plurality of first metal bodies and the plurality of second metal bodies form electrodes having different polarities.

15. The high power optical element streetlamp according to claim 11, wherein the plurality of first metal bodies and the plurality of second metal bodies of the thermocouple are formed of alloy material selected from the group consisting of platinum-rhodium, platinum rhodium-platinum, chromel-alumel, chromel-constantan, iron-constantan and copper-constantan.

* * * * *